United States Patent
Uprety et al.

(10) Patent No.: US 9,302,452 B2
(45) Date of Patent: Apr. 5, 2016

(54) TRANSPARENT LAMINATES COMPRISING INKJET PRINTED CONDUCTIVE LINES AND METHODS OF FORMING THE SAME

(75) Inventors: Krishna K. Uprety, Valencia, CA (US); Khushroo H. Lakdawala, Santa Clarita, CA (US); Alexander Bimanand, Burbank, CA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 671 days.

(21) Appl. No.: 13/411,476

(22) Filed: Mar. 2, 2012

(65) Prior Publication Data
US 2013/0228365 A1 Sep. 5, 2013

(51) Int. Cl.
*B32B 37/14* (2006.01)
*B32B 37/06* (2006.01)
(Continued)

(52) U.S. Cl.
CPC . *B32B 27/08* (2013.01); *B32B 3/08* (2013.01); *B32B 3/14* (2013.01); *B32B 3/16* (2013.01); *B32B 15/08* (2013.01); *B32B 15/082* (2013.01); *B32B 15/09* (2013.01); *B32B 15/095* (2013.01); *B32B 15/20* (2013.01); *B32B 17/10018* (2013.01); *B32B 17/1022* (2013.01); *B32B 17/1077* (2013.01); *B32B 17/10192* (2013.01); *B32B 17/10761* (2013.01); *B32B 17/10798* (2013.01); *B32B 27/28* (2013.01); *B32B 27/30* (2013.01); *B32B 27/36* (2013.01); *B32B 27/365* (2013.01); *B32B 27/40* (2013.01);
(Continued)

(58) Field of Classification Search
CPC ....... H05K 3/10; H05K 3/1241; H05K 3/125; H05K 1/0306
USPC ......................................... 174/257; 219/203
See application file for complete search history.

(56) References Cited

U.S. PATENT DOCUMENTS 4,128,448 A * 12/1978 Bitterice et al. ............... 156/166
4,932,755 A * 6/1990 Holdridge et al. ............ 359/896
(Continued)

FOREIGN PATENT DOCUMENTS

| CN | 101610948 A | 12/2009 |
|---|---|---|
| CN | 102311729 A | 1/2012 |
| JP | 2000-311527 A | 11/2000 |

OTHER PUBLICATIONS

Ag grid/ITOhybridtransparentelectrodespreparedbyinkjetprinting Jin-A. Jeong Article history: Received Dec. 29, 2010 Received inrevisedform Feb. 10, 2011 Accepted Feb. 19, 2011 Available online Mar. 12, 2011.*

(Continued)

*Primary Examiner* — Timothy Thompson
*Assistant Examiner* — Michael F McAllister
(74) *Attorney, Agent, or Firm* — Lewis Roca Rothgerber Christie LLP

(57) ABSTRACT

A transparency including a conductive mesh is disclosed. The conductive mesh is formed by a plurality of inkjet printed electrically conductive lines on a polymer film or a glass, polyacrylate, polycarbonate, or polyurethane substrate, wherein at least one inkjet printed electrically conductive line intersects at least one other inkjet printed electrically conductive line. A flying vehicle including a transparency including a conductive mesh is also disclosed. Additionally, a method of preparing a transparency by laminating a polymer film and a substrate together, wherein a conductive mesh is formed on the polymer film by a plurality of inkjet printed electrically conductive lines, is also disclosed.

16 Claims, 10 Drawing Sheets

(51) Int. Cl.

| | |
|---|---|
| *H05B 3/84* | (2006.01) |
| *B32B 27/08* | (2006.01) |
| *B32B 15/08* | (2006.01) |
| *B32B 15/082* | (2006.01) |
| *B32B 15/09* | (2006.01) |
| *B32B 15/095* | (2006.01) |
| *B32B 15/20* | (2006.01) |
| *B32B 17/10* | (2006.01) |
| *B32B 27/28* | (2006.01) |
| *B32B 27/30* | (2006.01) |
| *B32B 27/36* | (2006.01) |
| *B32B 27/40* | (2006.01) |
| *B32B 3/08* | (2006.01) |
| *B32B 3/14* | (2006.01) |
| *B32B 3/16* | (2006.01) |
| *B64C 1/14* | (2006.01) |
| *H01R 13/20* | (2006.01) |

(52) U.S. Cl.
CPC ............ *H05B 3/84* (2013.01); *B32B 2307/202* (2013.01); *B32B 2307/412* (2013.01); *B32B 2369/00* (2013.01); *B32B 2375/00* (2013.01); *B32B 2605/006* (2013.01); *B32B 2605/08* (2013.01); *B32B 2605/18* (2013.01); *H05B 2203/002* (2013.01); *H05B 2203/013* (2013.01); *H05B 2203/017* (2013.01); *Y10T 156/10* (2015.01)

(56) References Cited

U.S. PATENT DOCUMENTS

| | | | |
|---|---|---|---|
| 7,256,923 | B2 | 8/2007 | Liu et al. |
| 7,824,580 | B2 * | 11/2010 | Boll et al. .................... 252/514 |
| 2003/0124259 | A1 * | 7/2003 | Kodas et al. ............... 427/376.6 |
| 2005/0111070 | A1 * | 5/2005 | Lin et al. ...................... 359/265 |
| 2006/0186104 | A1 * | 8/2006 | Winter ......................... 219/203 |
| 2007/0128905 | A1 * | 6/2007 | Speakman .................... 439/161 |
| 2007/0201122 | A1 * | 8/2007 | Dozeman et al. ............. 359/265 |
| 2008/0144159 | A1 * | 6/2008 | Nerden ......................... 359/227 |
| 2009/0020215 | A1 * | 1/2009 | Hood et al. ................... 156/151 |
| 2009/0280329 | A1 | 11/2009 | Rukavina et al. |
| 2010/0025533 | A1 * | 2/2010 | Bimanand et al. ............ 244/121 |
| 2010/0301320 | A1 * | 12/2010 | Rand et al. ..................... 257/40 |
| 2010/0304069 | A1 * | 12/2010 | Oguri et al. .................... 428/38 |
| 2010/0315105 | A1 * | 12/2010 | Fornes .......................... 324/693 |

OTHER PUBLICATIONS

PCT International Preliminary Report on Patentability dated Sep. 2, 2014 for Application No. PCT/US2012/064979; 7 pages.
http://www.novacentrix.com/product/metalon.php, "Metalon® Conductive Inks," 1 page.
http://www-static.methode.com/static/cms_workspace/pdf/Sensors%20&%20Switches/Methode-Nano-Inks.pdf, "Nano-Silver and Nano-Carbon Inks," 3 pages.
http://vendor.parker.com/Groups/Seal/Divisions/Chomerics/Chomerics%20Product%20Library.nsf/5b3d26c6b2630956852573da0065b80c/80939478572e2c07852574260067990c/$FILE/E%20-%20Windows.pdf,"Design Guidelines to EMI Shielding Windows," pp. E1-E24.
Jacoby, Keith T., et al., "Predicted and measured EMI shielding effectiveness of a metallic mesh coating on a sapphire window over a broad frequency range," 11 pages.
Griggs, Charles, et al., "Opportunities for Inkjet Printing in Industrial Applications," Industrial + Specialty Printing, May/Jun. 2010, 4 pages.
Niklasson, Gunnar A., et al., "Electrochromics for smart windows: thin films of tungsten oxide and nickel oxide, and devices based on these," Journal of Materials Chemistry, 17, 2007, pp. 127-156.
Huang, et al., "Graphene-Based Conducting Inks for Direct Inkjet Printing of Flexible Conductive Patterns and Their applications in Electric Circuits and Chemical Sensors," Nano Research, 4(7), 2011, pp. 675-684.
Database WPI; Thomson Scientific; XP-002690188; C:\EPOPROGS\SEA\.\.\..\epodata\sea\eplogf\internal.log; Jan. 21, 2013; 2 pages.
PCT International Search Report and the Written Opinion of the International Searching Authority mailed Feb. 4, 2013 for International Application No. PCT/US2012/064979; 11 pages.
Chinese Office Action dated Aug. 28, 2015 of the corresponding Chinese Patent Application No. 201280071821.3, (22 pages).

* cited by examiner

TRANSPARENT LAMINATES COMPRISING INKJET PRINTED CONDUCTIVE LINES AND METHODS OF FORMING THE SAME

FIELD

The following description relates generally to a transparency including a conductivemesh. More specifically, the following description relates to a transparency including a conductive mesh formed by a plurality of inkjet printed electrically conductive lines, wherein at least one inkjet printed electrically conductive line intersects at least one other inkjet printed electrically conductive line, and to a flying vehicle or ground vehicle including the transparency. Further, the following description relates to methods of preparing a transparency including a conductive mesh.

BACKGROUND

Conductive transparencies have a variety of uses. For example, a conductive transparency can be used as a canopy, window or windshield of a flying vehicle (e.g., an aircraft), or as an armor-grade transparency of a ground vehicle, such as the windshield or windows of an AM General HMMWV ("HUMVEE®"). HUMVEE® is a registered trademark of AM General, LLC. When used as an aircraft canopy, window or windshield, or as an armor-grade transparency of a ground vehicle, it is beneficial for the transparency to have defogging and de-icing capabilities. For example, defogging and de-icing can be accomplished by, among other things, heating the transparency (e.g., window or windshield) via the conductive portion of the transparency, such as an indium tin oxide (ITO) layer or electroplated grid, thereby preventing or reducing the formation of ice or condensation, or thawing ice or evaporating condensation that has already formed, on the transparency. An ITO layer is sometimes included as the conductive portion of armor-grade transparencies.

It is also beneficial for conductive transparencies to be able to prevent or reduce the buildup of static charge and to have electromagnetic interference (EMI) shielding capabilities, thereby shielding electronic systems within the vehicle from electromagnetic interference. The buildup of static charge can be prevented or reduced by draining or dissipating the static electricity that can build up on the transparency as a result of precipitation static and/or lightning strikes. Additionally, EMI shielding can be provided by preventing or reducing the transmission of disruptive electromagnetic radiation (i.e., electromagnetic radiation that interferes with electronic systems) through the transparency.

Typical aircraft transparencies include conductive portions that are expensive to produce, and often are prepared with a low percent yield. For example, the conductive portion of the transparency may be a woven wire mesh. Further, some aircraft windows include an electroplated grid, which requires the application of an organic primer, copper, photomask and resist, and the electroplating of copper and nickel. Each of these process steps adds to the complexity of the process, increases manufacturing expense and increases the risk of handling damage. For example, typical aircraft transparencies and armor-grade transparencies are produced using vacuum deposition processes that require expensive chambers, are time consuming, and may, themselves, create defects in the transparency or its coatings.

Additionally, existing aircraft transparencies often do not provide satisfactory de-icing, static dissipation, and/or EMI shielding capabilities, and some of the conductive transparencies that are currently in use have unsatisfactory lifetimes.

Accordingly, there is a need for durable conductive aircraft transparencies and conductive armor-grade transparencies that can be configured to provide de-icing, static dissipation and/or EMI shielding properties, and that can be produced by simpler and more economical methods than traditional industrial techniques, such as electroplating, vacuum deposition, and the formation of woven wire mesh.

SUMMARY

Aspects of embodiments of the present invention are directed to a transparency including: a substrate; a polymer film on the substrate; and a conductive mesh formed by a plurality of inkjet printed electrically conductive lines on the polymer film, wherein at least one inkjet printed electrically conductive line intersects at least one other inkjet printed electrically conductive line. By including the conductive mesh, transparencies according to embodiments of the invention can be produced at a significantly lower cost than existing aircraft or armor-grade transparencies, as the production of the exemplary conductive mesh (and the exemplary transparency itself) does not require the very expensive vacuum deposition chambers required to produce typical transparencies. Additionally, the conductive mesh of embodiments of the invention can have any of a wide range of electrical conductivities and, consequently, can be configured to provide excellent EMI shielding or static dissipation and/or de-icing or defogging.

In certain embodiments, the transparency is configured to provide electromagnetic interference (EMI) shielding.

The plurality of inkjet printed electrically conductive lines may be configured to de-ice the transparency by heating the transparency when an electric current is passed through at least one inkjet printed electrically conductive line.

The conductive mesh may have a sheet resistance in a range of about 0.02 to about 1,000 ohms/sq.

The conductive mesh may have a sheet resistance in a range of about 0.02 to less than 400 ohms/sq.

The conductive mesh may have a sheet resistance in a range of about 0.02 to about 100 ohms/sq.

The conductive mesh may have a sheet resistance in a range of about 0.02 to about 4 ohms/sq.

In certain embodiments, the plurality of inkjet printed electrically conductive lines include an inkjet printed metal.

For example, the plurality of inkjet printed electrically conductive lines may include a metal selected from the group consisting of Cu, Au, Ni, Ag, and combinations thereof.

In certain embodiments, the polymer film includes polyethylene terephthalate, polycarbonate, or polyurethane.

In certain embodiments, the substrate includes glass, polyacrylate, polycarbonate, or polyurethane. For example, the polyurethane of the substrate may be OPTICOR, which may be obtained from PPG Industries Inc. OPTICOR is a trademark of PPG Industries Inc.

In certain embodiments, the transparency further includes: an overlayer on the polymer film; a first bonding film between the overlayer and the polymer film; and a second bonding film between the polymer film and the substrate.

The overlayer may include polycarbonate, polyacrylate, glass or polyurethane. For example, the polyurethane of the overlayer may be OPTICOR, which may be obtained from PPG Industries Inc. OPTICOR is a trademark of PPG Industries Inc.

The first bonding film may include polyurethane, polyvinyl butyral, or silicone.

The second bonding film may include polyurethane, polyvinyl butyral, or silicone.

In certain embodiments, the transparency has a visible light transmittance of about 60% or greater.

In certain embodiments, a flying vehicle includes a transparency according to any of the above.

Aspects of embodiments of the present invention are also directed to a transparency including: a substrate, the substrate including glass, polyacrylate, polycarbonate, or polyurethane; and a conductive mesh formed by a plurality of inkjet printed electrically conductive lines on the substrate, wherein at least one inkjet printed electrically conductive line intersects at least one other inkjet printed electrically conductive line.

Still other aspects of embodiments of the present invention are directed to a method of preparing a transparency, the method including: laminating a polymer film and a substrate together, wherein a conductive mesh is formed by a plurality of inkjet printed electrically conductive lines on the polymer film.

Laminating the polymer film and the substrate together may include: laminating an overlayer, a first bonding film, the polymer film, a second bonding film, and the substrate together.

Laminating the overlayer, the first bonding film, the polymer film, the second bonding film, and the substrate together may include: laminating the polymer film, the second bonding film, and the substrate together to form a laminated substrate; laminating the overlayer and the first bonding film together to form a laminated overlayer; and laminating the laminated substrate and the laminated overlayer together.

In certain embodiments, laminating the polymer film and the substrate together may include heating at a temperature in a range of about 125 to about 300° F. and pressing at a pressure in a range of about 50 to about 220 psi for a time period in a range of about 15 minutes to about 5 hours.

For example, laminating the polymer film, the second bonding film, and the substrate together may include heating at a temperature in a range of about 150 to about 300° F.

Laminating the polymer film, the second bonding film, and the substrate together may include pressing at a pressure in a range of about 50 to about 220 psi.

Laminating the polymer film, the second bonding film, and the substrate together may be carried out for a time period in a range of about 15 minutes to about 5 hours.

Laminating the overlayer and the first bonding film together to form a laminated overlayer may include heating at a temperature in a range of about 100 to about 300° F.

Laminating the overlayer and the first bonding film together to form a laminated overlayer may include pressing at a pressure in a range of about 100 to about 250 psi.

Laminating the overlayer and the first bonding film together to form a laminated overlayer may be carried out for a time period in a range of about 1 to about 5 hours.

Laminating the laminated substrate and the laminated overlayer together may include heating at a temperature in a range of about 100 to about 300° F.

Laminating the laminated substrate and the laminated overlayer together may include pressing at a pressure in a range of about 100 to about 250 psi.

Laminating the laminated substrate and the laminated overlayer together may be carried out for a time period in a range of about 1 to about 5 hours.

Embodiments of the present invention are also directed to a method of de-icing dr defogging an aircraft transparency, the method including: heating the transparency, the transparency including: a substrate; a polymer film on the substrate; and a conductive mesh formed by a plurality of crossing electrically conductive lines deposited on the polymer film by inkjet printing, wherein the transparency is attached to an aircraft, and heating the transparency includes applying an electric current to at least one of the electrically conductive lines.

Other embodiments of the present invention are directed to a method of de-icing or defogging an aircraft transparency, the method including: heating the transparency, the transparency including: a substrate; and a conductive mesh formed by a plurality of crossing electrically conductive lines deposited on the substrate by inkjet printing, wherein the transparency is attached to an aircraft, and heating the transparency includes applying an electric current to at least one of the electrically conductive lines.

Embodiments of the present invention are also directed to a method of configuring an aircraft to shield electromagnetic interference (EMI), the method including: attaching a transparency to an aircraft, wherein the transparency includes: a substrate; a polymer film on the substrate; and a conductive mesh formed by a plurality of crossing electrically conductive lines deposited on the polymer film by inkjet printing.

Other embodiments of the present invention are directed to a method of configuring an aircraft to shield electromagnetic interference (EMI), the method including: attaching a transparency to an aircraft, wherein the transparency includes: a substrate; and a conductive mesh formed by a plurality of crossing electrically conductive lines deposited on the substrate by inkjet printing.

Embodiments of the present invention are also directed to a method of de-icing or defogging an armor-grade transparency, the method including: heating the armor-grade transparency, the armor-grade transparency including: a ballistic substrate; a polymer film on the ballistic substrate; and a conductive mesh formed by a plurality of crossing electrically conductive lines deposited on the polymer film by inkjet printing, wherein heating the armor-grade transparency includes applying an electric current to at least one of the electrically conductive lines.

Still other embodiments of the present invention are directed to a method of de-icing or defogging an armor-grade transparency, the method including: heating the armor-grade transparency, the armor-grade transparency including: a ballistic substrate; and a conductive mesh formed by a plurality of crossing electrically conductive lines deposited on the ballistic substrate by inkjet printing, wherein heating the armor-grade transparency includes applying an electric current to at least one of the electrically conductive lines.

Embodiments of the present invention are also directed to a method of configuring a vehicle to shield electromagnetic interference (EMI), the method including: attaching an armor-grade transparency to a vehicle, wherein the transparency includes: a ballistic substrate; a polymer film on the ballistic substrate; and a conductive mesh formed by a plurality of crossing electrically conductive lines deposited on the polymer film by inkjet printing.

Other embodiments of the present invention are directed to a method of configuring a vehicle to shield electromagnetic interference (EMI), the method including: attaching an armor-grade transparency to a vehicle, wherein the transparency includes: a ballistic substrate; and a conductive mesh formed by a plurality of crossing electrically conductive lines deposited on the ballistic substrate by inkjet printing.

Embodiments of the present invention are also directed to an a smart window, the smart window including: a transparent substrate; a first transparent electrode on the transparent substrate; a transmittance controlling layer on the first transparent electrode, the transmittance controlling layer being configured to vary the light transmittance of the smart window;

and a second transparent electrode on the transmittance controlling layer, wherein one of the first and second transparent electrodes includes a conductive mesh formed by a plurality of inkjet printed electrically conductive lines, wherein at least one inkjet printed electrically conductive line intersects at least one other inkjet printed electrically conductive line.

In certain embodiments, the smart window further includes a polymer film between the first transparent electrode and the transparent substrate.

In one embodiment, the smart window includes a polymer film on the second transparent electrode.

The conductive mesh may be inkjet printed directly on the polymer film or it may be inkjet printed directly on the transparent substrate.

BRIEF DESCRIPTION OF THE DRAWINGS

The accompanying drawings, together with the specification, illustrate exemplary embodiments of the present invention, and, together with the description, serve to explain the principles of the invention.

DETAILED DESCRIPTION

Figure 1:
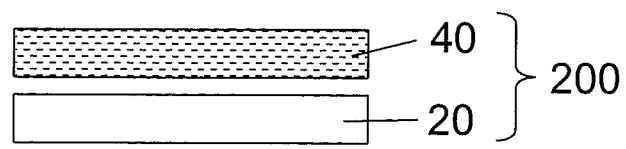
FIG. 1 is an exploded, cross-sectional view of a transparency including a conductive mesh.

In the following detailed description and in the claims, various films and layers are described as being "on" one or more additional films and layer(s). This language simply denotes the relative positions of the films and layers. Thus, in some embodiments, two films and/or layers are literally right next to each other, while in other embodiments, the same two films and/or layers are separated by one or more additional film(s) and/or layer(s). In each case, one of the two films and/or layers is considered to be "on" the other film or layer. Also, "on" can mean "below." For example, a film or layer that is "on" another film or layer can also be considered "below" the other film or layer, depending upon the point of view. Additionally, as used herein, the term "film" refers to a thin, flexible sheet that does not hold a static shape when it is not supported by another feature.

Embodiments of the present invention are directed to a transparency including a conductive mesh. Such a transparency has a variety of uses, for example as a canopy, window, or windshield for a flying vehicle (e.g., an aircraft), or as an armor-grade windshield or window of a ground vehicle. For example, a transparency according to an embodiment of the invention may be used as the windshield or windows of an AM General HMMWV ("HUMVEE®"). Accordingly, exemplary embodiments of the present invention are directed to a flying vehicle including a transparency including a conductive mesh.

In certain embodiments, the conductive mesh is formed by a plurality of inkjet printed electrically conductive lines on a polymer film, wherein at least one inkjet printed electrically conductive line intersects at least one other inkjet printed electrically conductive line. Exemplary conductive meshes can be obtained from CIMA Nanotech, Inc., Dontech, Inc., Applied Nanotech Holdings, Inc., NanoMas Technologies, Inc., and FUJIFILM Dimatix, Inc. In other embodiments, the conductive mesh is formed by a plurality of inkjet printed electrically conductive lines on (e.g., physically contacting) a substrate, wherein at least one inkjet printed electrically conductive line intersects at least one other inkjet printed electrically conductive line. For example, the plurality of inkjet printed electrically conductive lines may be inkjet printed directly on a substrate, such as for example glass, polyacrylate, polycarbonate, or polyurethane. In certain embodiments, the polyurethane of the substrate is OPTICOR, which may be obtained from PPG Industries Inc. OPTICOR is a trademark of PPG Industries Inc. For example, the polyurethane of the substrate may be any polyurethane set forth in U.S. Patent Application Publication No. 2009/0280329 A1, the entire contents of which are herein incorporated by reference. Exemplary electrically conductive lines can be prepared by inkjet printing conductive inks, such as the METALON® conductive inks available from Novacentrix. METALON® is a registered trademark of Novacentrix. Embodiments of the invention are directed to methods of preparing a transparency including a conductive mesh.

The present invention will now be described with reference to the accompanying drawings, in which exemplary embodiments of the invention are shown. The drawings are illustrative in nature and are not to be construed as limiting the present invention. In the drawings, the thickness of films, layers and regions may be exaggerated for ease of illustration.

An exemplary embodiment of the transparency is shown in FIG. 1. The transparency 200 shown in FIG. 1 can be used as a canopy, window or windshield of an aircraft, or as an armor-grade transparency, such as an armor-grade transparency for a ground vehicle. As shown in FIG. 1, the transparency 200 includes a substrate 20 and a conductive mesh 40. The conductive mesh 40 includes a plurality of inkjet printed electrically conductive lines, wherein at least one inkjet printed electrically conductive line intersects at least one other inkjet printed electrically conductive line. The conductive mesh 40 may be on a polymer film, and the plurality of inkjet printed electrically conductive lines may physically contact the polymer film. Alternatively, the plurality of inkjet printed electrically conductive lines may be inkjet printed directly on the substrate 20 (e.g., the inkjet printed electrically conductive lines may physically contact the substrate 20). The transparency, however, is not limited to having a single conductive mesh. For example, the conductive mesh 40 may be repeated to form a stacked structure on the substrate 30. The conductive mesh 40 may also be on opposite sides of the substrate 20 to form a sandwich structure. The conductive mesh 40 on opposite sides of the substrate 20 may be a single films, or multiple films that form a stacked structure.

According to certain embodiments of the present invention, the plurality of electrically conductive lines are spaced apart from one another. For example, the plurality of inkjet printed electrically conductive lines may be spaced apart by any distance suitable for a conductive mesh that provides EMI shielding, de-icing and/or defogging. For example, the spacings should have a size that is suitable for preventing or reducing transmission through the transparency of the particular range of electromagnetic radiation that is being shielded. If the spacings are too large (e.g., larger than the wavelength of electromagnetic radiation to be shielded), the conductive mesh will not provide the desired shielding. In view of the effect of such spacings on the EMI shielding properties of the conductive mesh, the spacings in the mesh should be smaller or substantially smaller than the wavelength of the electromagnetic radiation that is being shielded (e.g., substantially smaller than the wavelength of the disruptive electromagnetic radiation that interferes with electronic systems).

Figure 2:
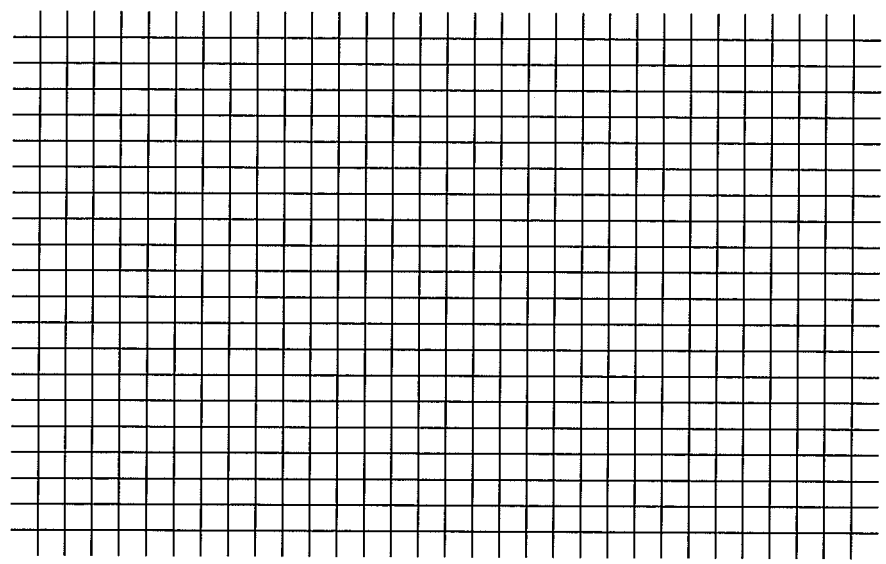
FIG. 2 is a schematic view of a plurality of electrically conductive lines according to an exemplary embodiment of the present invention.

The arrangement of the inkjet printed electrically conductive lines in the mesh, however, is not limiting. That is, the mesh (i.e., the plurality of inkjet printed electrically conductive lines) may be arranged in any form of pattern or tessellation. For example, the mesh may be arranged as a square grid, triangular tiling, hexagonal tiling, or grid formed from straight, undulating, sinusoidal or zigzag lines. The mesh may be arranged in any form of uniform, non-uniform, repeating or random pattern. An exemplary embodiment of a square grid arrangement of the plurality of inkjet printed electrically conductive lines can be seen in the schematic view of the conductive mesh shown in FIG. 2. As can be seen in FIG. 2, the plurality of inkjet printed electrically conductive lines are shown as straight lines, which define a repeating pattern of squares between the inkjet printed electrically conductive lines. In that particular embodiment, each of the inkjet printed electrically conductive lines has a width about 25 µm, but they are not limited thereto. Additionally, in that particular embodiment, each square between the inkjet printed electrically conductive lines has a width of about 250 µm, but they are not limited thereto.

Figure 3:
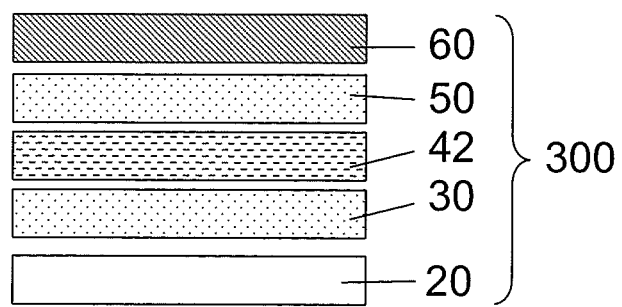
FIG. 3 is an exploded, cross-sectional view of a transparency including a conductive mesh.
Figure 4:
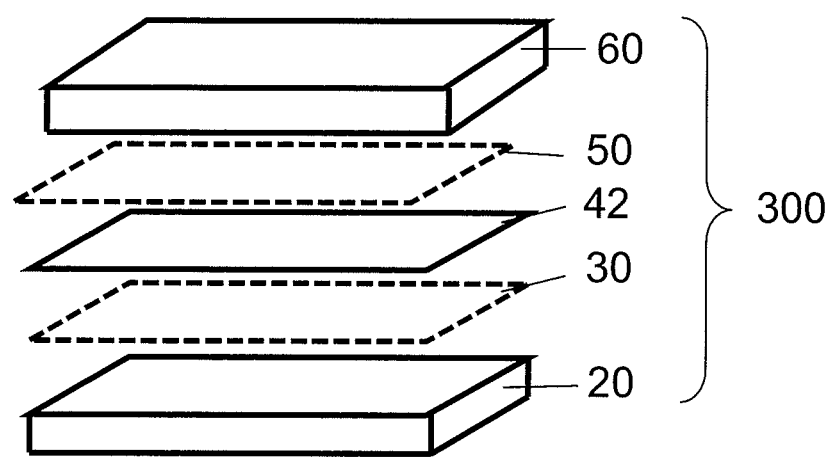
FIG. 4 is an exploded, perspective view of a transparency including a conductive mesh.

Additional films and layers of the transparency according to embodiments of the present invention will now be described. Depending upon the particular embodiment, these additional films and/or layers may or may not be present in the transparency. For example, a transparency according to an embodiment of the present invention is shown in FIG. 3. Additionally, an exploded perspective view of the transparency according to this embodiment is also shown in FIG. 4. As can be seen in FIGS. 3 and 4, the transparency 300 includes an overlayer 60, a first bonding film 50, a conductive mesh formed by a plurality of inkjet printed electrically conductive lines on a polymer film 42, a second bonding film 30, and a substrate 20. The overlayer 60, first bonding film 50, polymer film 42 and second bonding film 30 may be stacked on the substrate 20 once, or they may be repeated multiple times to form multiple stacked structures. Additionally, these films and layers may be on opposite sides of the substrate 20, to form a sandwich structure. The films and layers on the opposite sides of the substrate 20 may be stacked once, or they may be repeated multiple times to form multiple stacked structures.

The overlayer 60 protects the transparency. It should be durable and should be able to resist scratching or other forms of physical damage. The overlayer should also resist damage from weather or other forms of chemical attack. For example, the overlayer 60 may include any suitable organic resin, such as polyacrylate (e.g., polymethylmethacrylate (PMMA)), polycarbonate (e.g., bisphenol A polycarbonate), or polyurethane, glass, or any other material having suitable transmissive and protective properties. In certain embodiments, the polyurethane of the overlayer is OPTICOR, which may be obtained from PPG Industries Inc. OPTICOR is a trademark of PPG Industries Inc. For example, the polyurethane of the overlayer may be any polyurethane set forth in U.S. Patent Application Publication No. 2009/0280329 A1, the entire contents of which are herein incorporated by reference. The overlayer may have a thickness in a range of about 0.1 to about 0.75 inches.

The first bonding film 50 covers imperfections in the overlayer 60 and promotes adhesion of the overlayer 60 to the polymer film 42. For example, the first bonding film 50 couples the overlayer 60 to the polymer film 42, and should be capable of bonding thereto. In certain embodiments, the first bonding film 50 includes polyurethane, polyvinyl butyral (PVB), silicone, or any other material having suitable adhesive properties. The polyurethane may have a molecular weight in a range of 100,000 to 300,000 g/mol, but it is not limited thereto. The polyvinylbutyral may have a molecular weight in a range of 200,000 to 300,000 g/mol, but it is not limited thereto. The first bonding film 50 may have a thickness in a range of about 0.003 to about 0.100 inches.

Similarly to the first bonding film 50, the second bonding film 30 covers imperfections in the substrate 20 and promotes adhesion of the substrate 20 to the polymer film 42. As such, second bonding film 30 couples the substrate 20 to the polymer film 42, and should be capable of bonding thereto. In certain embodiments, the second bonding film 30 includes polyurethane, polyvinyl butyral (PVB), silicone, or any other material having suitable adhesive properties. The polyurethane may have a molecular weight in a range of 100,000 to 300,000 g/mol, but it is not limited thereto. The polyvinylbutyral may have a molecular weight in a range of 200,000 to 300,000 g/mol, but it is not limited thereto. The second bonding film 30 may have a thickness in a range of about 0.003 to about 0.100 inches.

As set forth above, in certain embodiments, the conductive mesh is formed by a plurality of inkjet printed electrically conductive lines on the polymer film 42. The plurality of inkjet printed electrically conductive lines can be inkjet printed on any suitable polymer film, such as, for example, polyethylene terephthalate, polycarbonate, or polyurethane. According to other embodiments of the present invention, the conductive mesh is formed by a plurality of inkjet printed electrically conductive lines inkjet printed on glass, polyacrylate, polycarbonate, or any other suitable substrate. In any of the embodiments of the invention, the plurality of electrically conductive lines can be prepared by inkjet printing conductive inks, such as the METALON® conductive inks available from Novacentrix. In certain embodiments, the plurality of inkjet printed electrically conductive lines include any suitable inkjet printed metal, such as a metal selected from the group consisting of copper (Cu), gold (Au), nickel (Ni), silver (Ag), and combinations thereof. For example, the plurality of inkjet printed electrically conductive lines may include Cu. The plurality of electrically conductive inkjet printed lines may further include epoxy, or any other material having suitable binding properties.

As described further below, the plurality of inkjet printed electrically conductive lines may be formed such that the transparency is configured to provide EMI shielding. Additionally, as described further below, the plurality of inkjet printed electrically conductive lines may be configured to de-ice the transparency by heating the transparency when an electric current is passed through at least one inkjet printed electrically conductive line. The EMI shielding or de-icing capabilities of an exemplary transparency may result from the sheet resistance of the conductive mesh 40. For example, in certain embodiments, the conductive mesh 40 may have a sheet resistance in a range of about 0.02 to about 1,000 ohms/sq. In other embodiments, the conductive mesh 40 may have a sheet resistance of less than 400 ohms/sq. In still other embodiments, the conductive mesh 40 may have a sheet resistance of less than 100 ohms/sq.

The conductive mesh 40 may be on a polymer film 42. The polymer film may include any suitable polymer, such as polyethylene terephthalate, polycarbonate, or polyurethane, but the present invention is not limited thereto. In certain embodiments, the plurality of electrically conductive lines physically contact the polymer film. For example, the plurality of inkjet printed electrically conductive lines may be inkjet printed on the polymer film (e.g., deposited on the polymer film by inkjet printing). The polymer film may have a thickness in a range of about 70 µm to about 1,000 µm. The plurality of inkjet printed electrically conductive lines may each have a width in a range of about 20 µm to about 50 µm. The plurality of inkjet printed electrically conductive lines may each have a thickness in a range of about 50 nm to about 5 µm. The thickness and/or width of the electrically conductive lines may be varied to vary the EMI shielding, de-icing and/or defogging properties of the transparency.

Similarly to the overlayer 60, the substrate 20 also protects the transparency 300. As such, the substrate 20 should be durable and should be able to resist scratching or other forms of physical damage. The substrate should also resist damage from weather or other forms of chemical attack. For example, the substrate 20 may include any suitable organic resin, such as polycarbonate (e.g., bisphenol A polycarbonate), polyacrylate (e.g., polymethylmethacrylate (PMMA)), or polyurethane, glass, or any other material having suitable transmissive and protective properties. In certain embodiments, the polyurethane of the substrate is OPTICOR, which may be obtained from PPG Industries Inc. OPTICOR is a trademark of PPG Industries Inc. For example, the polyurethane of the substrate may be any polyurethane set forth in U.S. Patent Application Publication No. 2009/0280329 A1, the entire contents of which are herein incorporated by reference. The substrate may have a thickness in a range of about 0.125 to about 0.75 inches.

Methods of preparing the transparency now will be described generally. For example, according to one embodiment of the present invention, a method of preparing a transparency includes inkjet printing onto a substrate, wherein at least one inkjet printed electrically conductive line intersects at least one other inkjet printed electrically conductive line. As discussed above, the substrate may include glass, polyacrylate, polycarbonate, OPTICOR, or any other material having suitable transmissive and protective properties. In certain embodiments, the polyurethane of the substrate is OPTICOR, which may be obtained from PPG Industries Inc. OPTICOR is a trademark of PPG Industries Inc. For example, the polyurethane of the substrate may be any polyurethane set forth in U.S. Patent Application Publication No. 2009/0280329 A1, the entire contents of which are herein incorporated by reference. The inkjet printed electrically conductive lines may be formed by inkjet printing any suitable ink onto the substrate. For example, electrically conductive lines can be prepared by inkjet printing conductive inks, such as the METALON® conductive inks available from Novacentrix onto the substrate. The inkjet printing may be performed according to any suitable inkjet printing technique, such as those described in Huang, Lu, et al., Graphene-based conducting inks for direct inkjet printing of flexible conductive patterns and their applications in electric circuits and chemical sensors, Nano Research (2011), vol. 4, issue 7, 675-684, the entire contents of which are herein incorporated by reference.

Inkjet printing has the advantages of being a low-cost, non-contact application that is compatible with a wide array of substrates. Additionally, inkjet printing does require mask patterning, can be done at low temperature, and does not require vacuum processing. Inkjet printing can deposit conductive fluids without contacting the substrate. Inkjet printers can be driven digitally with a computer to draw gridlines precisely. The inkjet printer may have several nozzles spaced apart by a distance of about 254 microns and may form drop sizes in a range of about 1 to about 10 picoliters, but the present invention is not limited thereto. In certain embodiments, the nozzles apply the ink droplets to the substrate as a result of the piezoelectric effect. For example, as described in Griggs, C., et al., *Opportunities for Inkjet Printing in Industrial Applications*, Industrial+ Specialty Printing, May/Jun. 2010 (available at http://wwvv.dimatix.com/files/isp05-0610p18-22.pdf), the entire contents of which are herein incorporated by reference, inkjet printing may be used to print features as small as 20 µm.

Figure 5:
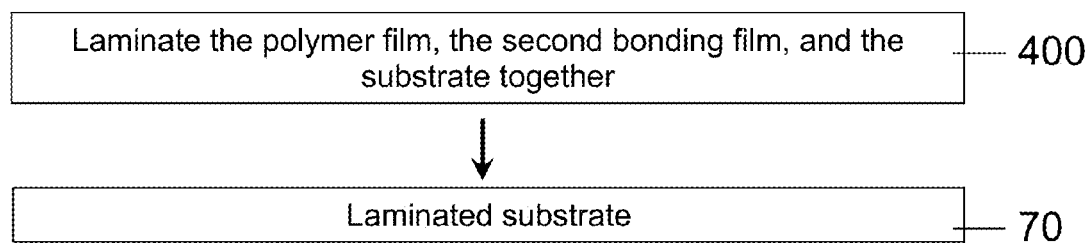
FIG. 5 is a flowchart showing lamination of the polymer film, the second bonding film, and the substrate together to form a laminated substrate.
Figure 6:
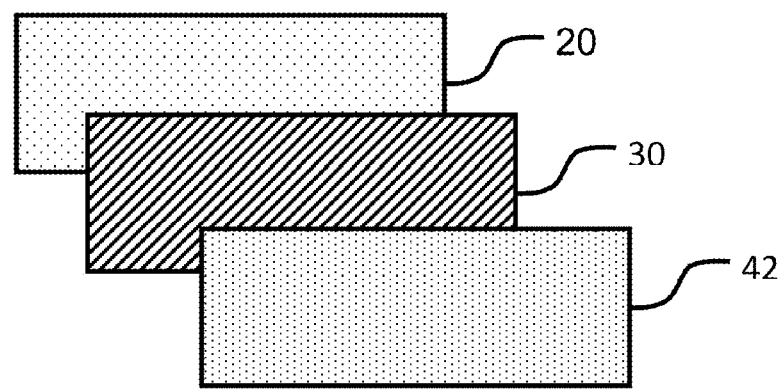
FIG. 6 is a schematic illustration showing lamination of the polymer film, the second bonding film, and the substrate together to form a laminated substrate.

In another embodiment of the present invention, a method of preparing a transparency includes laminating a polymer film and a substrate together, wherein a conductive mesh is formed by a plurality of inkjet printed electrically conductive lines on the polymer film. For example, as shown in FIG. 5, the polymer film, the second bonding film, and the substrate (e.g., the polymer film 42, the second bonding film 30, and the substrate 20) may be laminated together in a lamination process 400 to form a laminated substrate 70. A schematic illustration of this lamination process is shown in FIG. 6. This lamination process may include heating the polymer film, the second bonding film, and the substrate at a temperature in a range of about 200 to about 300° F. Further, this lamination process may include pressing the polymer film, the second bonding film, and the substrate at a pressure in a range of about 50 to about 250 psi. Laminating the polymer film, the second bonding film, and the substrate together may be carried out for a time period in a range of about 15 minutes to about 5 hours.

Figure 7:
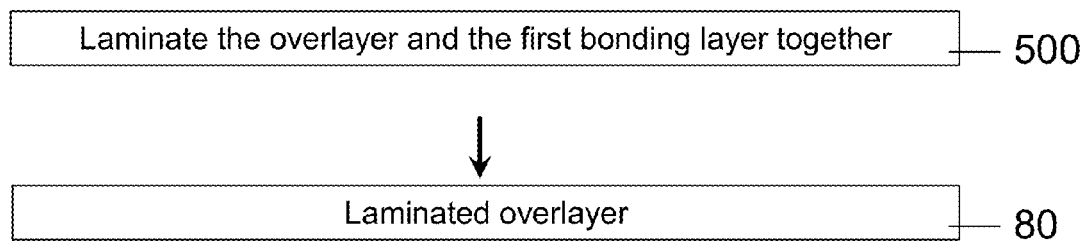
FIG. 7 is a flowchart showing lamination of the overlayer and the first bonding film together to form a laminated overlayer.
Figure 8:
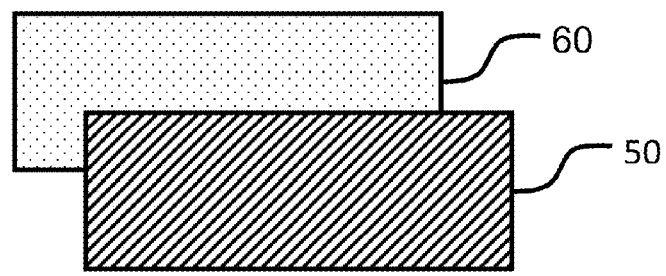
FIG. 8 is a schematic illustration showing lamination of the overlayer and the first bonding film together to form a laminated overlayer.

As shown in FIG. 7, the overlayer and the first bonding film (e.g., the overlayer 60 and the first bonding film 50) may be laminated together in a lamination process 500 to form a laminated overlayer 80. A schematic illustration of this lamination process is shown in FIG. 8. This lamination process may include heating the overlayer and the first bonding film at a temperature in a range of about 100 to about 300° F. Further, this lamination process may include pressing the overlayer and the first bonding film at a pressure in a range of about 100 to about 250 psi. Laminating the overlayer and the first bonding film together may be carried out for a time period in a range of about 1 to about 5 hours.

Figure 9:
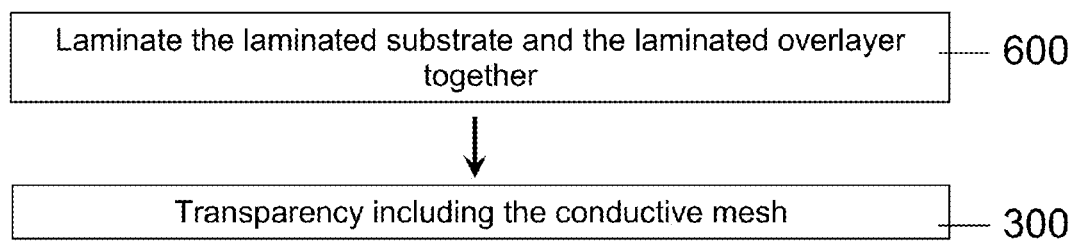
FIG. 9 is a flowchart showing lamination of the laminated overlayer and the laminated substrate together to form a transparency.
Figure 10:
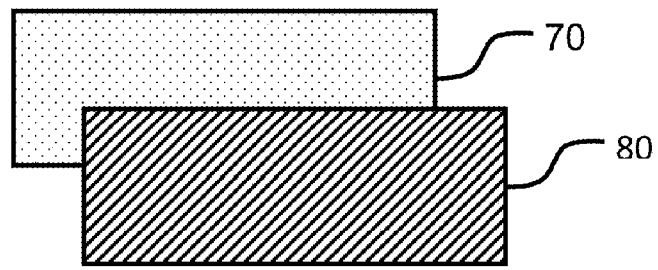
FIG. 10 is a schematic illustration showing lamination of the laminated overlayer and the laminated substrate together to form a transparency.

As shown in FIG. 9, the laminated overlayer 80 and the laminated substrate 70 may be laminated together in a lamination process 600 to form a transparency 300. A schematic illustration of this lamination process is shown in FIG. 10. This lamination process may include heating the laminated overlayer and the laminated substrate at a temperature in a range of about 100 to about 300° F. Further, this lamination process may include pressing the laminated overlayer and the laminated substrate at a pressure in a range of about 100 to about 250 psi. Laminating the laminated overlayer and the laminated substrate together may be carried out for a time period in a range of about 1 to about 5 hours. One or more of the above-described lamination processes may be carried out in an airtight vacuum plastic bag that has been evacuated. Additionally, one or more of the above-described lamination processes may be carried out in an autoclave.

A transparency according to embodiments of the present invention may be a flat or shaped transparency. Accordingly, the above-described methods of preparing the transparency may also include shaping the transparency. The transparency may be shaped before, during, or after any of the above-described preparation processes. For example, the substrate may be shaped before, during or after the inkjet printing of the plurality of electrically conductive lines directly on the substrate. Additionally, the substrate may be shaped before, during or after the laminating of the substrate and the polymer film together. For example, the substrate may be shaped before or after the polymer film, the second bonding film, and the substrate are laminated together to form the laminated substrate, or it may be shaped during that lamination process. Further, the substrate may be shaped before or after the overlayer and the first bonding film are laminated together to form the laminated overlayer, or it may be shaped during that lamination process. Similarly, the substrate may be shaped before or after the laminated overlayer and the laminated substrate are laminated together to form the transparency, or it may be shaped during that lamination process.

Transparencies according to embodiments of the invention provide significant advantages over existing aircraft transparencies and armor-grade transparencies. For example, by using the conductive meshes described herein, transparencies according to the present invention can be made without using the multi-million dollar vacuum deposition chambers required to prepare existing aircraft transparencies and armor-grade transparencies. Accordingly, the transparencies described herein can be produced at a much lower cost than existing aircraft and armor-grade transparencies.

While Conductive meshes have been available, they have not been used in aerospace applications (e.g., for aircraft transparencies), and such conductive meshes have not been used in connection with armor-grade transparencies. These applications (e.g., aerospace and armor-grade transparency applications) have particular requirements (as discussed further below), and it was not previously known that conductive meshes according to embodiments of the invention would suitably meet these requirements. Indeed, the present inventors were surprised by the remarkable performance of the presently described transparencies and conductive meshes in aerospace and armor-grade applications. Upon testing these conductive meshes and transparencies, however, the present inventors unexpectedly discovered that they exhibit excellent durability, EMI shielding, de-icing, and/or defogging capabilities.

Although conductive meshes may also be suitable for use with, for example, display devices, the conductive meshes of the present invention are directed to the particular requirements of aerospace and armor-grade transparency applications. For example, the conductive meshes according to embodiments of the present invention include the particular thicknesses, materials, configurations, and/or sheet resistance described herein. Conductive meshes for other applications, such as display devices, may not configured for the requirements of aerospace and armor-grade transparency applications. For example, conductive meshes for display devices, in which dust is a primary concern, may be too thin and have too high of a sheet resistivity for aerospace and armor-grade transparency applications. Additionally, conductive meshes for display devices are not configured for de-icing or defogging.

Exemplary transparencies of the present invention may be configured to provide the EMI shielding required for an aircraft or armor-grade transparency. That is, the transparency may be configured to prevent or reduce the transmission of disruptive electromagnetic radiation (i.e., electromagnetic radiation that interferes with electronic systems) through the transparency. By preventing or reducing the transmission of disruptive electromagnetic radiation through the transparency, the transparency prevents or reduces the effect of electromagnetic interference on electronic systems, such as electronic systems within an aircraft. Additionally, the EMI shielding of the transparency prevents or reduces the effects of electromagnetic interference emitted from electronic systems within the aircraft on electronic systems outside of the aircraft.

The EMI shielding properties of the conductive mesh result, at least in part, from its electrical conductivity. For example, the application of an electric field to one side of the conductive mesh may induce a current in the conductive mesh, which causes the movement of charges within the conductive mesh and thereby cancels the field on the other side of the transparency. As a result of the induced current, certain electromagnetic radiation (e.g., electromagnetic radiation that interferes with electronic systems) is at least partially reflected by the conductive mesh, thereby preventing or reducing the transmission of that electromagnetic radiation through the transparency. Oscillating magnetic fields interact with the conductive mesh in a substantially similar manner, but static magnetic fields do not.

Figure 11:
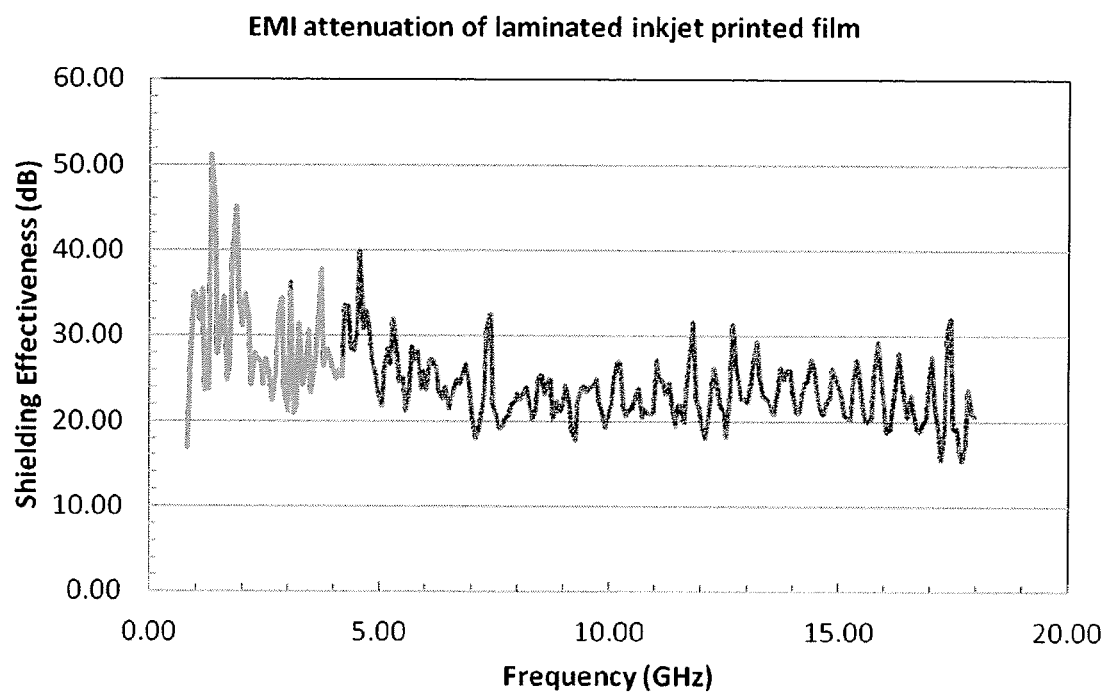
FIG. 11 is a graph showing the EMI shielding effectiveness of an exemplary transparency over a range of frequencies.

Because the EMI shielding of the conductive mesh results, at least in part, from the induced current in the conductive mesh, the shielding effectiveness of the conductive mesh is at least partially dependent upon the resistance (or sheet resistance; i.e., electrical conductivity) of the conductive mesh. For example, as the resistance (or sheet resistance) of the conductive mesh increases, it becomes more difficult to induce a current within the conductive mesh. Consequently, increasing the resistance of the conductive mesh typically reduces the EMI shielding effectiveness of the conductive mesh. Accordingly, the transparency may be configured to provide EMI shielding by appropriately selecting the electrical conductivity (or sheet resistance) of the conductive mesh. For example, the EMI shielding effectiveness of an exemplary transparency, which includes an exemplary conductive mesh between a polycarbonate substrate and a polycarbonate overlayer, can be seen in the graph shown in FIG. 11. As can be seen in FIG. 11, the transparency provides EMI shielding in a range of about 20 to about 50 dB for electromagnetic radiation having a frequency in a range of about 1 GHz to about 18 GHz, and the average shielding effectiveness at 18 GHz is 25 dB. When configured to provide the EMI shielding required for an aircraft or armor-grade transparency, the transparency may include an electrical connection, such as bus bars, but such an electrical connection may not be necessary to provide EMI shielding.

Additionally, the electrical conductivity of the conductive mesh may allow the transparency to prevent or reduce the buildup of static charge on the transparency that would otherwise result from precipitation and/or lightning strikes. For example, the conductive mesh may have a low sheet resistance (i.e., high electrical conductivity), and thereby drain or dissipate the static charge that would otherwise buildup on the transparency. A conductive mesh having low sheet resistance may also provide additional advantages, such as radar attenuation. Accordingly, the conductive mesh may have a sheet resistance in a range of about 0.02 to about 1,000 ohms/sq. For example, the conductive mesh may have a sheet resistance of less than 400 ohms/sq, or less than 100 ohms/sq. In contrast to embodiments of the present invention, a sheet resistance of less than 0.3 ohms/sq cannot be achieved with a continuous indium tin oxide (ITO) conductive coating, which, in some cases, may be required for special aircraft transparencies.

In addition to the resistance (or sheet resistance) of the conductive mesh, the EMI shielding of the conductive mesh also depends upon the composition of the conductive mesh (e.g., the composition of the inkjet printed electrically conductive lines), the thickness of each inkjet printed electrically conductive line, the size of the shielded volume, the frequency and size of the electromagnetic radiation being shielded, and the characteristics of the spacings between the inkjet printed electrically conductive lines in the conductive mesh.

In addition to, or instead of, being configured to provide EMI shielding capabilities, the transparency may be configured to de-ice or defog the transparency by heating the transparency when an electric current is passed through at least one inkjet printed electrically conductive line of the conductive mesh. That is, defogging or de-icing may be accomplished by applying an electric current to at least a portion of the conductive mesh to heat the transparency (e.g., the canopy, window, or windshield of an aircraft, or windshield or window of an armored vehicle), thereby preventing or reducing the formation of condensation or ice, or evaporating or melting the condensation or ice that has already formed, on the transparency.

Figure 12:
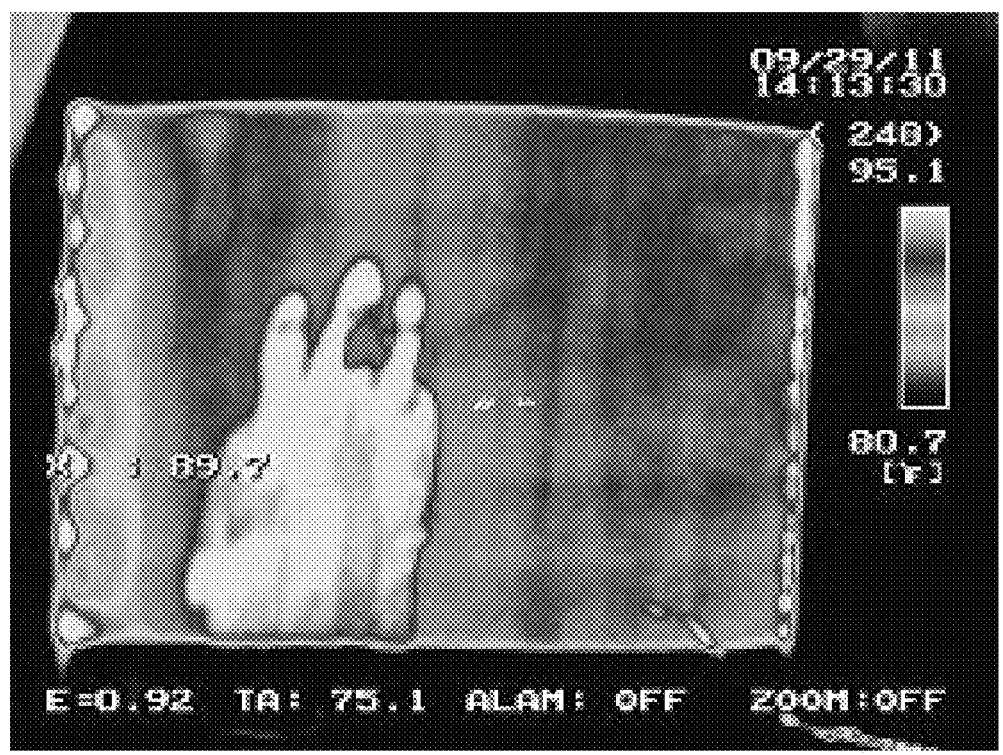
FIG. 12 is a thermograph showing the heating pattern of a transparency according to an exemplary embodiment of the present invention.

For example, the heating patterns of transparencies according to exemplary embodiments of the present invention can be seen in the infrared thermograph shown in FIG. 12. The infrared thermograph was obtained using a thermal imaging camera that detects radiation in the infrared range of the electromagnetic spectrum and produces a thermal image of the windshield/window. The windshield/window was powered using 14/18 DC volts until the surface temperature of the windshield/window reached 100 to 150° F., and then the thermal image of the windshield/window was recorded. As can be seen in these infrared thermographs, the exemplary transparencies exhibited excellent heating patterns that are suitable for defogging or de-icing the canopy, window, or windshield of an aircraft, despite the very low sheet resistance (e.g., about 0.02 to about 4 ohms/sq) of the conductive mesh. The heating patterns observed in FIG. 12 provide unexpected and desirable results over existing aircraft transparencies and armor-grade transparencies, in that the exemplary transparencies exhibited more uniform heating as compared to certain existing transparencies.

Furthermore, the particular de-icing and/or defogging capabilities of an exemplary transparency may be tailored to the particular application. Typically, an aircraft cockpit windshield requires greater de-icing capabilities than does an aircraft cockpit side window and, consequently, the aircraft cockpit windshield typically has a greater number of watts per square inch applied to it (e.g., about 4 to about 5 W/in. sq.) than does the aircraft cockpit side window (e.g., about 1 to about 2 W/in. sq.). As such, the de-icing and/or defogging capabilities of the transparency may be tailored to a particular application by appropriately selecting the sheet resistivity of the conductive mesh. Additionally, the transparency may include an electrical connection, such as bus bars, to accomplish the de-icing or defogging.

Although a transparency according to embodiments of the present invention may be configured to have de-icing or EMI shielding capabilities independently, the present inventors have also surprisingly discovered that a transparency according to embodiments of the present invention can be configured to have both de-icing and EMI shielding capabilities (e.g., capabilities that are beneficial for an aircraft transparency). The combination of de-icing and EMI shielding capabilities of a transparency according to embodiments of the present invention provide unexpected and desirable results over existing aircraft transparencies.

Figure 13:
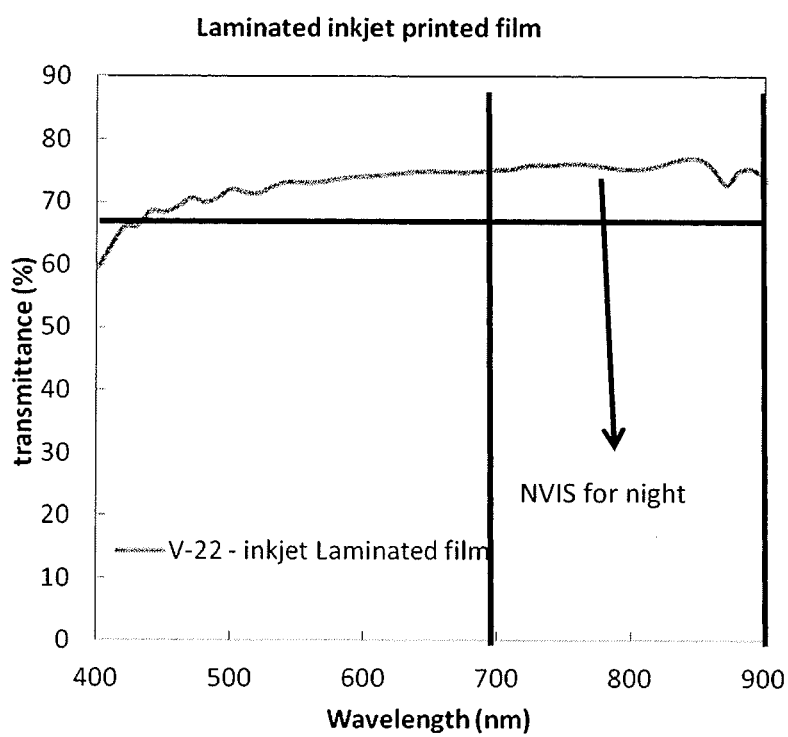
FIG. 13 is a graph showing light transmittance of an exemplary transparency over a range of wavelengths of light.

In addition to de-icing and/or EMI shielding capabilities, a transparency according to embodiments of the present invention also has a very high visible light transmittance. For example, such a transparency may have a visible light transmittance of greater than 60%, greater than 65%, greater than 70%, or greater than 84%. As can be seen in the graph shown in FIG. 13, a transparency according to an exemplary embodiment of the present invention has a high light transmittance in the visible light range (e.g., for wavelengths of about 400 nm to about 750 nm) as well as in the near infrared range (e.g., wavelengths of about 700 to about 900 nm). For example, the graph in FIG. 13 shows that a transparency according to an exemplary embodiment of the present invention had a light transmittance of about 74% for wavelengths of about 700 to about 900 nm. The near infrared range is particularly useful for night vision applications that allow a user to see images using a broader spectrum of electromagnetic radiation than is observable with the naked eye by using an apparatus that converts near infrared light to visible light.

Additionally, embodiments of the present invention are directed to transparencies, such as smart windows or switchable windows, that have variable light transmission properties. For example, embodiments of the present invention are directed to electrochromic devices, suspended particle devices, and liquid crystal devices. The above-described conductive mesh may be used as one or more of the transparent electrodes in any of the afore-mentioned devices. For example, the electrochromic device, suspended particle device, or liquid crystal device may include a transparent electrode including a conductive mesh formed by a plurality of inkjet printed electrically conductive lines, wherein at least one inkjet printed electrically conductive line intersects at least one other inkjet printed electrically conductive line. When used as a transparent electrode in these devices, the conductive mesh may be on a polymer film or it may be on a substrate, as described above with respect to the other embodiments of the invention. The operation or configuration of the conductive mesh is substantially the same as in the previous exemplary embodiments and, therefore, further description thereof will not be provided.

Figure 14:
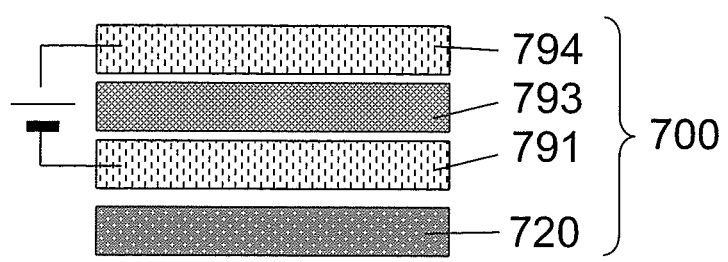
FIG. 14 is an exploded, cross-sectional view of a smart window according to an exemplary embodiment of the invention.

In one embodiment, a smart window includes: a transparent substrate; a first transparent electrode on the transparent substrate; a transmittance controlling layer on the first transparent electrode, the transmittance controlling layer being configured to vary the light transmittance of the smart window; and a second transparent electrode on the transmittance controlling layer, wherein one of the first and second transparent electrodes includes a conductive mesh formed by a plurality of inkjet printed electrically conductive lines on the transparent substrate, wherein at least one inkjet printed electrically conductive line intersects at least one other inkjet printed electrically conductive line. FIG. 14 is an exploded, cross-sectional view of a smart window including a conductive mesh according to an exemplary embodiment of the invention. As can be seen in FIG. 14, the smart window includes a substrate 720, a first transparent electrode 791, a transmittance controlling layer 793, and a second electrode 794. Either or both of the first and second transparent electrodes 791 and 794, respectively, may include the conductive mesh. The substrate 720 may be any suitable substrate, including those substrates described with respect to the previous exemplary embodiments. The transmittance controlling layer 793 may include any electrochromic material, suspended particles, or liquid crystals suitable for changing the transmittance of the smart window.

Figure 15:
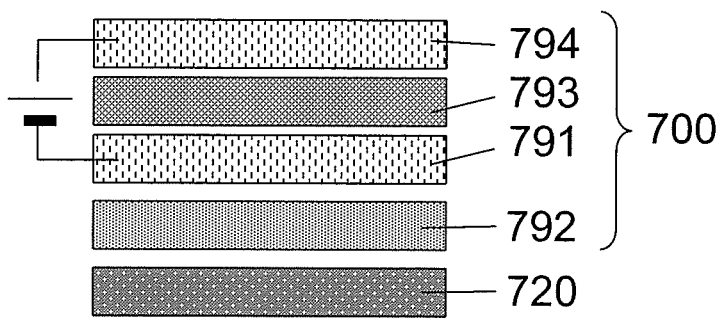
FIG. 15 is an exploded, cross-sectional view of a smart window according to another exemplary embodiment of the invention.
Figure 16:
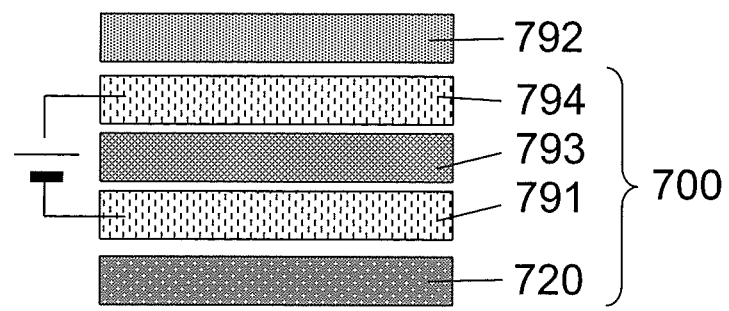
FIG. 16 is an exploded, cross-sectional view of a smart window according to another exemplary embodiment of the invention.

In certain embodiments, the smart window also includes a polymer film. For example, FIG. 15 is an exploded, cross-sectional view of an exemplary smart window including a polymer film 792 between the substrate 720 and the first transparent electrode 791. Additionally, FIG. 16 is an exploded cross-sectional view of an exemplary smart window including a polymer film 792 on the second transparent electrode 794. The polymer film may be any suitable polymer film as described above. As described above, the conductive mesh may be inkjet printed directly on the polymer film 792 or it may be inkjet printed directly on the transparent substrate 720.

As a transparent electrode, the conductive mesh may be configured to provide an electrical signal to cause a change in the transparency and/or color of the device by causing a change in the electrochromic material, suspended particles, polymer, or liquid crystals of the transmittance controlling layer. The device may include any suitable electrochromic material, such as electrochromic polymers (e.g., polyaniline), viologens, polyoxotungstates, tungsten oxide, nickel oxide, and/or tungsten dioxide. Exemplary electrochromic devices are described in more detail in U.S. Pat. No. 7,256,923, the entire contents of which are herein incorporated by reference. Additional exemplary smart windows are described in more detail in Niklasson, G. A., and Granqvist, C. G., *Electrochromics for smart windows: thin films of tungsten oxide and nickel oxide, and devices based on these*, J. Mater. Chem., 17, 127-156 (2007), the entire contents of which are herein incorporated be reference.

The following example is presented for illustrative purposes only and is not to be viewed as limiting the scope of the present invention.

EXAMPLE 1

Several exemplary transparencies were prepared according to embodiments of the present invention. The transparencies were prepared by laminating a conductive mesh formed by a plurality of inkjet printed electrically conductive lines on a polymer film, a second bonding film and a glass substrate together to form a laminated substrate. An exemplary conductive mesh on a polymer film can be obtained from CIMA Nanotech, Inc., Dontech, Inc., Applied Nanotech Holdings, Inc., NanoMas Technologies, Inc. and FUJIFILM Dimatix, Inc. Before lamination, two conductive bus-bars (1 cm wide) were vertically applied over the conductive mesh to provide application sites for the braids. These braids were used to record the resistance of the laminated transparency. In this particular example, the second bonding layer included polyurethane. The conductive mesh formed by the plurality of inkjet printed electrically conductive lines on the polymer film, the second bonding film, and the substrate were placed in an airtight vacuum plastic bag, which was then evacuated. The conductive mesh formed by the plurality of inkjet printed electrically conductive lines on the polymer film, the second bonding film, and the substrate were laminated together at a temperature in a range of about 200 to about 250° F., at a pressure in a range of about 50 to about 100 psi, and for a time period of about 60 to about 90 minutes to form a laminated substrate.

An overlayer and a first bonding film were laminated together to form a laminated overlayer. In this particular example, the overlayer included polycarbonate and the first bonding layer included polyurethane. The overlayer and the first bonding film were placed in an airtight vacuum plastic bag, which was then evacuated. The overlayer and the first bonding film were laminated together at a temperature in a range of about 200 to about 250° F., at a pressure in a range of about 120 to about 150 psi, and for a time period of about 1 to about 2 hours to form a laminated overlayer.

The laminated overlayer and the laminated substrate were laminated together to form an exemplary transparency. The laminated overlayer and the laminated substrate were placed in an airtight vacuum plastic bag, which was then evacuated. The laminated overlayer and the laminated substrate were laminated together at a temperature in a range of about 125 to about 175° F., at a pressure in a range of about 100 to about 200 psi, and for a time period of about 1 to about 2 hours to form an exemplary transparency.

Environmental durability tests were performed on laminated coupons prepared according to Example 1. Each laminated coupon approximates the characteristics of an aircraft windshield. Neither the optical nor the resistive properties of the coupons experienced substantial degradation. The results of the environmental durability tests are shown below in Table 1. QUV and humidity tests performed on the coupons show no substantial degradation on the resistance and light transmission. Additionally, the bond tensile strength of the laminated window with inkjet printed film was measured to be 1200 psi. For the purpose of characterizing the bonding strength, each laminated coupon was cut into a 2 inch by 2 inch specimen. Each specimen was attached between two aluminum cubic blocks (2 cubic inch size) using epoxy adhesive (9460 HYSOL). HYSOL is a registered trademark of Henkel Corporation. The bonding strength was measured using a tensile testing machine from United Calibration Corp. by pulling each of the aluminum cubic blocks in a direction perpendicular to the bonding interface until the bond ruptured. The test pulling speed was 0.05 inch.min, and a personal computer was used to control the pulling speed and the data acquisition.

Haze and Luminous Transmittance Tests

A 6 inch by 12 inch coupon prepared according to Example 1 was tested according to ASTM D1003 using a Haze-Gard Plus instrument. Haze is a measure of the clearness and transparency of the transparency (the transparency should not diffuse substantial amounts of light), while the luminous or visible light transmittance indicates the amount of visible light transmitted through the sample. The coupon exhibited a visible light transmittance of 68-70% and a haze of 3-4%. According to the test results, the coupon meets the visible light transmittance and haze values required for aircraft canopy, windshield and windows, which are 65% or above and 10% or below, respectively.

Sheet Resistance Test

The sheet resistance of a 6 inch by 12 inch coupon prepared according to Example 1 was tested using a four point probes surface resistivity meter from Guardian Manufacturing Inc. The sheet resistance of the conductive mesh was determined to be 0.15-0.3 ohm/sq before lamination, and 0.25-0.48 ohm/sq after lamination.

Humidity Test

A 6 inch by 12 inch coupon prepared according to Example 1 was exposed to 100% condensing humidity at 122° F. (50° C.) for 13 weeks. Prior to the humidity test, the coupon exhibited a visible light transmittance of 69.3% and haze of 3.65%, as determined by the above-described haze and luminous transmittance tests. After the humidity test, the coupon exhibited a visible light transmittance of 70% and a haze of 3.61%, as determined by the above-described have and luminous transmittance test. According to the test results, the visible light transmittance and haze of the coupon was not significantly altered by the humidity test.

Humidity and Solar Radiation (QUV) Test

A 6 inch by 12 inch coupon prepared according to Example 1 was exposed to ultraviolet (UV) radiation for 8 hours at 158° F. (70° C.). The coupon was then exposed to condensation for 4 hours at 122° F. (50° C.). The cycles were repeated for a total of 2,184 hours (10 weeks). Prior to the QUV test, the coupon exhibited a visible light transmittance of 68.9% and haze of 3.87%. After the QUV test, the coupon exhibited a visible light transmittance of 68.7% and haze of 3.76%, as determined by the above-described haze and luminous transmittance test. As can be seen in Table 1, the QUV test did not significantly alter the visible light transmittance or haze of the coupon.

Some of the above-described test results are summarized below in Tables 1 and 2.

TABLE 1

|  | Initial | 1 week | 2 weeks | 3 weeks | 4 weeks |
|---|---|---|---|---|---|
| Resistance ($\Omega$) after QUV test | 0.45 | 0.37 | 0.37 | 0.37 | 0.42 |
| Transmittance (%) after QUV test | 68.9 | 69.2 | 69.1 | 69.1 | 69 |
| Haze (%) after QUV test | 3.87 | 3.19 | 3.08 | 3.14 | 3.26 |
| Resistance ($\Omega$) after humidity test | 0.25 | 0.32 | 0.37 | 0.4 | 0.37 |
| Transmittance (%) after humidity test | 69.6 | 69.7 | 70 | 69.8 | 70.02 |
| Haze (%) after humidity test | 3.65 | 3.46 | 3.19 | 3.39 | 3.33 |

TABLE 2

|  | 5 weeks | 7 weeks | 8 weeks | 9 weeks | 10 weeks | 13 weeks |
|---|---|---|---|---|---|---|
| Resistance ($\Omega$) after QUV test | 0.42 | 0.45 | 0.42 | 0.42 | 0.42 | 0.37 |
| #3 Transmittance (%) after QUV test | 69 | 68.9 | 68.9 | 68.9 | 68.2 | 68.7 |
| Haze (%) after QUV test | 3.37 | 3.47 | 3.13 | 3.13 | 3.63 | 3.76 |
| Resistance ($\Omega$) after humidity test | 0.42 | 0.45 | 0.35 | 0.35 | 0.37 | 0.4 |
| Transmittance (%) after humidity test | 70 | 70 | 69.1 | 69.9 | 70.2 | 70 |
| Haze (%) after humidity test | 3.70 | 3.41 | 3.60 | 3.6 | 3.87 | 3.61 |

Thermal Cycling Data

Thermal (temperature) cycling tests of the laminated coupons were carried out to evaluate the environmental durability of the coupons under extreme weather conditions (e.g., −40° F. to 150° F.). In the thermal cycling tests, bus to bus resistance of the conductive mesh was measured at room temperature (RT), 20° F., 0° F., −20° F., −40° F., room temperature, and 150° F. Thermal cycling between −40° F. and 150° F. of the laminated coupons showed no significant effect on the sheet resistance after 20 cycles. The results of the thermal cycling are summarized below in Table 3.

TABLE 3

| | Temperature | | | | | | |
|---|---|---|---|---|---|---|---|
| Cycle | R ($\Omega$) at RT | R ($\Omega$) at 20° F. | R ($\Omega$) at 0° F. | R ($\Omega$) at −20° F. | R ($\Omega$) at −40° F. | R ($\Omega$) at RT | R($\Omega$) At 150° F. |
| $1^{st}$ cycle | 0.48 | 0.48 | 0.48 | 0.48 | 0.48 | 0.48 | 0.52 |
| $2^{nd}$ cycle | 0.48 | 0.48 | 0.48 | 0.48 | 0.48 | 0.52 | 0.52 |
| $3^{rd}$ cycle | 0.48 | 0.48 | 0.48 | 0.48 | 0.48 | 0.48 | 0.52 |
| $4^{th}$ cycle | 0.48 | 0.48 | 0.48 | 0.48 | 0.43 | 0.48 | 0.52 |
| $5^{th}$ cycle | 0.48 | 0.48 | 0.48 | 0.48 | 0.43 | 0.48 | 0.57 |
| $6^{th}$ cycle | 0.48 | 0.48 | 0.48 | 0.48 | 0.43 | 0.48 | 0.57 |
| $7^{th}$ cycle | 0.48 | 0.48 | 0.48 | 0.48 | 0.43 | 0.48 | 0.52 |
| $8^{th}$ cycle | 0.48 | 0.48 | 0.48 | 0.48 | 0.43 | 0.48 | 0.57 |
| $9^{th}$ cycle | 0.48 | 0.48 | 0.48 | 0.43 | 0.48 | 0.52 | 0.57 |
| $10^{th}$ cycle | 0.48 | 0.48 | 0.48 | 0.48 | 0.48 | 0.52 | 0.52 |
| $11^{th}$ cycle | 0.52 | 0.48 | 0.48 | 0.48 | 0.48 | 0.57 | 0.57 |
| $12^{th}$ cycle | 0.48 | 0.48 | 0.48 | 0.48 | 0.48 | 0.48 | 0.52 |
| $13^{th}$ cycle | 0.48 | 0.48 | 0.48 | 0.48 | 0.43 | 0.48 | 0.52 |
| $14^{th}$ cycle | 0.48 | 0.52 | 0.48 | 0.48 | 0.48 | 0.48 | 0.52 |
| $15^{th}$ cycle | 0.52 | 0.48 | 0.48 | 0.48 | 0.48 | 0.48 | 0.57 |
| $16^{th}$ cycle | 0.48 | 0.48 | 0.52 | 0.48 | 0.48 | 0.48 | 0.57 |
| $17^{th}$ cycle | 0.48 | 0.48 | 0.52 | 0.48 | 0.48 | 0.48 | 0.57 |
| $18^{th}$ cycle | 0.48 | 0.48 | 0.48 | 0.48 | 0.48 | 0.48 | 0.57 |
| $19^{th}$ cycle | 0.48 | 0.48 | 0.48 | 0.48 | 0.48 | 0.48 | 0.57 |
| $20^{th}$ cycle | 0.48 | 0.48 | 0.48 | 0.48 | 0.48 | 0.48 | 0.57 |

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A flying vehicle comprising a transparency comprising:
 a substrate;
 a polymer film on the substrate; and
 a conductive mesh formed by a plurality of inkjet printed electrically conductive lines on the polymer film,
 wherein the polymer film comprises polyethylene terephthalate, polycarbonate, or polyurethane,
 wherein at least one inkjet printed electrically conductive line intersects at least one other inkjet printed electrically conductive line, and
 wherein the conductive mesh has a sheet resistance in a range of about 0.15 to about 1,000 ohms/sq.

2. The transparency of claim 1, wherein the transparency is configured to provide electromagnetic interference (EMI) shielding.

3. The flying vehicle of claim 1, wherein the plurality of inkjet printed electrically conductive lines are configured to de-ice the transparency by heating the transparency when an electric current is passed through at least one inkjet printed electrically conductive line.

4. The flying vehicle of claim 1, wherein the plurality of inkjet printed electrically conductive lines comprise an inkjet printed metal.

5. The flying vehicle of claim 1, wherein the plurality of inkjet printed electrically conductive lines comprise a metal selected from the group consisting of Cu, Au, Ni, Ag, and combinations thereof.

6. The flying vehicle of claim 1, wherein the substrate comprises glass, polyacrylate, polycarbonate, or polyurethane.

7. The flying vehicle of claim 1, further comprising:
an overlayer on the polymer film;
a first bonding film between the overlayer and the polymer film; and
a second bonding film between the polymer film and the substrate.

8. The flying vehicle of claim 7, wherein the overlayer comprises glass, polycarbonate, polyacrylate, or polyurethane.

9. The flying vehicle of claim 7, wherein the first bonding film comprises polyurethane, polyvinyl butyral, or silicone.

10. The flying vehicle of claim 7, wherein the second bonding film comprises polyurethane or polyvinyl butyral.

11. The flying vehicle of claim 1, wherein the transparency has a visible light transmittance of about 60% or greater.

12. A smart window comprising the transparency of claim 1, wherein the conductive mesh is a first transparent electrode and the smart window further comprises: a transmittance controlling layer on the first transparent electrode, the transmittance controlling layer being configured to vary the light transmittance of the smart window; and a second transparent electrode on the transmittance controlling layer.

13. A flying vehicle comprising a transparency comprising:
a substrate, the substrate comprising glass, polycarbonate, or polyurethane; and
a conductive mesh formed by a plurality of inkjet printed electrically conductive lines directly on the substrate,
wherein at least one inkjet printed electrically conductive line intersects at least one other inkjet printed electrically conductive line, and
wherein the conductive mesh has a sheet resistance in a range of about 0.15 to about 1,000 ohms/sq.

14. The flying vehicle of claim 1, wherein the conductive mesh has a sheet resistance in a range of about 0.25 to about 1,000 ohms/sq.

15. The flying vehicle of claim 13, wherein the conductive mesh has a sheet resistance in a range of about 0.25 to about 1,000 ohms/sq.

16. A flying vehicle comprising a transparency comprising:
a substrate;
a polymer film on the substrate; and
a conductive mesh formed by a plurality of inkjet printed electrically conductive lines on the polymer film,
wherein the polymer film comprises polyethylene terephthalate, polycarbonate, or polyurethane,
wherein the plurality of inkjet printed electrically conductive lines are free of silver,
wherein at least one inkjet printed electrically conductive line intersects at least one other inkjet printed electrically conductive line, and
wherein the conductive mesh has a sheet resistance in a range of about 0.02 to about 1,000 ohms/sq.

* * * * *